US006352811B1

(12) United States Patent
Patel et al.

(10) Patent No.: US 6,352,811 B1
(45) Date of Patent: Mar. 5, 2002

(54) THERMAL DIGITAL LITHOGRAPHIC PRINTING PLATE

(75) Inventors: Jayanti Patel, Woodcliff Lake; Shahhikant Saraiya, Parlin, both of NJ (US); Celin Savariar-Hauck, Badenhausen (DE); Jianbing Huang, Woodridge, NJ (US); Frederic Mikell, Parsippany; Ken-ichi Shimazu, Briarcliff Manor, both of NY (US); Nishith Merchant, North Bergon, NJ (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/469,490

(22) Filed: Dec. 22, 1999

Related U.S. Application Data

(63) Continuation-in-part of application No. 09/301,866, filed on Apr. 29, 1999
(60) Provisional application No. 60/090,300, filed on Jun. 23, 1998.

(51) Int. Cl.$^7$ .................................................. G03F 7/09
(52) U.S. Cl. ................................ 430/270.1; 430/273.1; 430/302; 101/467
(58) Field of Search .............................. 430/156, 270.1, 430/273.1, 271.1, 281.1, 302; 101/467

(56) References Cited

U.S. PATENT DOCUMENTS

| | | | | | |
|---|---|---|---|---|---|
| 3,645,733 | A | | 2/1972 | Brinckman et al. | 430/325 |
| 4,308,368 | A | | 12/1981 | Kubo et al. | 525/504 |
| 4,687,727 | A | | 8/1987 | Toyama et al. | 430/175 |
| 4,973,572 | A | * | 11/1990 | DeBoer | 503/227 |
| 5,112,743 | A | | 5/1992 | Kamiya et al. | 430/175 |
| 5,145,763 | A | | 9/1992 | Bassett et al. | 430/169 |
| 5,340,699 | A | | 8/1994 | Haley et al. | 430/302 |
| 5,493,971 | A | | 2/1996 | Lewis et al. | 101/454 |
| 5,529,891 | A | * | 6/1996 | Wang et al. | 430/523 |
| 5,536,619 | A | * | 7/1996 | Verburgh | 430/273.1 |
| 5,569,573 | A | * | 10/1996 | Takahashi et al. | 430/138 |
| 5,609,993 | A | | 3/1997 | Hase et al. | 430/302 |
| 5,641,608 | A | | 6/1997 | Grunwald et al. | 430/302 |
| 5,858,604 | A | * | 1/1999 | Takeda et al. | 430/162 |
| 5,858,626 | A | | 1/1999 | Sheriff et al. | 430/326 |
| 6,004,728 | A | * | 12/1999 | Deroover et al. | 430/302 |
| 6,022,667 | A | * | 2/2000 | Vermeersch et al. | 430/271.1 |
| 6,066,434 | A | * | 5/2000 | Blanchet-Fincher et al. | 430/273.1 |
| 6,083,663 | A | * | 7/2000 | Vermeersch et al. | 430/302 |
| 6,096,481 | A | * | 8/2000 | Vermeersch et al. | 430/302 |
| 6,130,026 | A | * | 10/2000 | Bennett et al. | 430/303 |
| 6,153,353 | A | * | 11/2000 | Van Damme et al. | 430/270.1 |
| 6,280,899 | B1 | * | 8/2001 | Parsons et al. | 430/270.1 |
| 6,294,311 | B1 | * | 9/2001 | Shimazu et al. | 430/271.1 |

FOREIGN PATENT DOCUMENTS

| | | | |
|---|---|---|---|
| DE | 2626769 | | 1/1977 |
| DE | 4231324 | | 1/1993 |
| EP | 0368327 | | 5/1990 |
| EP | 0 678 380 A2 | | 10/1995 |
| EP | 784 233 | * | 7/1997 |
| EP | 0784233 | | 7/1997 |
| EP | 0864419 | | 9/1998 |
| EP | 0864420 | | 9/1998 |
| EP | 0901902 | | 3/1999 |
| EP | 0908779 | | 4/1999 |
| EP | 0909657 | | 4/1999 |
| EP | 0943451 | | 9/1999 |
| GB | 1245924 | | 9/1971 |
| GB | 1546633 | | 5/1979 |
| JP | 09034110 | | 7/1995 |
| WO | 9739894 | | 10/1997 |
| WO | 9911458 | | 3/1999 |
| WO | 9921715 | | 5/1999 |

* cited by examiner

*Primary Examiner*—Janet Baxter
*Assistant Examiner*—Barbara Gilmore
(74) *Attorney, Agent, or Firm*—Ratner & Prestia

(57) ABSTRACT

A thermal lithographic printing plate, which can be imaged by thermal energy typically by imagewise exposure with an infrared emitting laser, a thermal printing head, etc., is made up of a hydrophilic substrate, and a composite layer structure composed of two layer coatings. Preferably, the first layer of the composite is composed of an aqueous developable polymer mixture containing a solubility inhibiting material and a photothermal conversion material which is contiguous to the hydrophilic substrate. The second layer of the composite is insoluble in the aqueous solution, is ink receptive, and is composed of one or more non-aqueous soluble polymers which are soluble or dispersible in a solvent which does not dissolve the first layer. The plate is exposed with an infrared laser or a thermal print head, and upon aqueous development of the imaged plate, the exposed portions are removed exposing hydrophilic substrate surfaces receptive to conventional aqueous fountain solutions. The unexposed portions contain the ink-receptive image areas. The second layer may also contain a photothermal conversion material. Alternatively, the composite layer may be free of photothermal conversion material when thermal imaging is carried out using a thermal printing head.

53 Claims, No Drawings

THERMAL DIGITAL LITHOGRAPHIC PRINTING PLATE

CROSS REFERENCES TO RELATED APPLICATIONS

This application is a Continuation-In-Part of U. S. patent application Ser. No. 09/301,866 filed Apr. 29, 1999, which claims priority from Provisional Application U.S. Serial No. 60/090,300 filed Jun. 23, 1998.

BACKGROUND OF THE INVENTION

1. Field of the Invention

The present invention relates to thermal lithographic printing plates which are imaged with an infrared laser and processed with an aqueous alkaline developer.

2. Description of Related Art

U.S. Pat. No. 5,340,699 discloses a radiation-sensitive composition especially adapted to prepare a lithographic printing plate that is sensitive to both ultraviolet and infrared radiation and is capable of functioning in either a positive-working or negative-working manner. The disclosed composition is comprised of (1) a resole resin, (2) a novolac resin, (3) a latent Bronsted acid and (4) an infrared absorber. The solubility of the composition in aqueous alkaline developing solution is both reduced in exposed areas and increased in unexposed areas by the steps of imagewise exposure to activating radiation and heating.

U.S. Pat. No. 5,858,626 discloses a lithographic printing plate having a single sensitive layer. The sensitive layer is composed of an infrared imaging composition which contains two essential components, namely an infrared absorbing compound, and a phenolic resin that is either mixed or reacted with an o-diazonaphthoquinone derivative. These compositions are useful in positive-working elements such as lithographic printing plates that can be adapted to direct-to-plate imaging procedures.

WO 97/39894 discloses a lithographic printing plate which contains a lithographic base overcoated with a complex of a developer-insoluble phenolic resin and a compound which forms a thermally frangible complex with the phenolic resin. This complex is less soluble in the developer solution than the uncomplexed phenolic resin. However when the complex is imagewise heated the complex breaks down which allows the non-complexed phenolic resin to dissolve in the developing solution. Thus the solubility differential between the heated areas of the phenolic resin and the unheated areas is increased when the phenolic resin is complexed. Preferably a laser-radiation absorbing material is also present on the lithographic base. Examples of compounds which form a thermally frangible complex with the phenolic resin are disclosed and include quinolinium compounds, benzothiazolium compounds, pyridinium compounds and imidazoline compounds.

WO 99/11458 discloses a lithographic printing plate which contains a support with a hydrophilic surface overcoated with an imaging layer. The imaging layer contains at least one polymer having bonded pendent groups which are hydroxy, carboxylic acid, tert-butyl-oxycarbonyl, sulfonamide, amide, nitrile, urea, or combinations thereof; as well as an infrared absorbing compound. The imaging layer may contain a second polymer which has bonded pendent groups which are 1,2-napthoquinone diazide, hydroxy, carboxylic acid, sulfonamide, hydroxymethyl amide, alkoxymethyl amide, nitrile, maleimide, urea, or combinations thereof. The imaging layer may also contain a visible absorption dye, a solubility inhibiting agent, or both. A method is disclosed for directly imaging the lithographic printing surface using infrared radiation without the requirement of pre- or post- UV-light exposure, or heat treatment. In practice, the imaging layer is imagewise exposed to infrared radiation to produce exposed image areas in the imaged layer which have transient solubility in aqueous alkaline developing solution, so that solubility is gradually lost over a period of time until the imaged areas become as insoluble as non-imaged areas. Within a short time period of the imaging exposure, the imaged layer is developed with an aqueous alkaline developing solution to form the lithographic printing surface. In this method, the infrared radiation preferably is laser radiation which is digitally controlled.

U.S. Pat. No. 5,493,971 discloses lithographic printing constructions which include a grained-metal substrate, a protective layer that can also serve as an adhesion-promoting primer, and an ablatable oleophilic surface layer. In operation, imagewise pulses from an imaging laser interact with the surface layer, causing ablation thereof and, probably, inflicting some damage to the underlying protective layer as well. The imaged plate may then be subjected to a solvent that eliminates the exposed protective layer, but which does no damage either to the surface layer or to the unexposed protective layer lying thereunder.

A heat-sensitive imaging element for making positive working lithographic printing plates is disclosed in European Patent Publication EP 0864420 A1. The imaging element disclosed comprises a lithographic base, a layer comprising a polymeric material which is soluble in an aqueous alkaline solution and an IR-radiation sensitive second layer. Upon image-wise exposure and absorption of IR-radiation in the second (top) layer, the capacity of the aqueous alkaline solution to penetrate and/or solubilize the second layer is changed. Image-wise exposure can be performed with an infrared laser with a short as well as with a long pixel dwell time.

Although advances have been made in the preparation of heat-sensitive elements for the production of lithographic printing plates, there remains a need for such elements having improved sensitivity to infrared laser imaging devices. There is also a need for longer shelf-life with wider development latitude and wider exposure latitude without the production of undesired sludge in the processors.

SUMMARY OF THE INVENTION

These needs are met by the present invention which is a positive-working thermal imaging element comprising;

A. a substrate; and

B. a thermally sensitive composite layer structure having an inner surface contiguous to the substrate and an outer surface, the composite layer structure comprising:

(a) a first layer having the inner surface, the first layer comprising a first polymeric material, wherein the first polymeric material is soluble or dispersible in an aqueous solution, and a solubility inhibiting material which reduces the solubility of the first layer in the aqueous solution; and (b) a second layer having the outer surface, the second layer comprising a second polymeric material, wherein the second layer is insoluble in the aqueous solution, and wherein when the first layer is free of photothermal conversion material, the second layer is free of photothermal conversion material;

wherein, upon heating the composite layer structure, the heated composite layer structure has an increased rate of removal in the aqueous solution.

More particularly, the present invention is a positive-working, lithographic printing plate, precursor comprising;

A. a hydrophilic substrate; and

B. a thermally sensitive composite layer structure having an inner surface contiguous to the hydrophilic substrate and an outer oleophilic surface, the composite layer structure comprising:

(a) a first layer having the inner surface, the first layer comprising a first polymeric material and photothermal conversion material, wherein the first polymeric material is soluble or dispersible in an aqueous solution, and a solubility inhibiting material which reduces the solubility of the first layer in the aqueous solution; and (b) a second layer having the outer oleophilic surface, the second layer comprising a second polymeric material, wherein the second layer is insoluble in the aqueous solution;

wherein, upon heating the composite layer structure, the heated composite layer structure has an increased rate of removal in the aqueous solution.

An added embodiment of this invention is a method for forming a planographic printing plate comprising the steps, in the order given:

I) providing a lithographic printing plate precursor comprising;

A. a hydrophilic substrate; and

B. a thermally sensitive composite layer structure having an inner surface contiguous to the hydrophilic substrate and an outer oleophilic surface, the composite layer structure comprising:

(a) a first layer having the inner surface, the first layer comprising a first polymeric material, wherein the first polymeric material is soluble or dispersible in an aqueous solution, and a solubility inhibiting material which reduces the solubility of the first layer in the aqueous solution; and (b) a second layer having the outer oleophilic surface, the second layer comprising a second polymeric material, wherein the second layer is insoluble in the aqueous solution, and wherein when the first layer is free of photothermal conversion material the second layer is free of photothermal conversion material;

II) imagewise exposing the composite layer structure to thermal energy to provide exposed portions and complimentary unexposed portions in the composite layer structure, wherein the exposed portions are selectively removable by the aqueous solution; and III) applying the aqueous solution to the outer oleophilic surface to remove the exposed portions to produce an imaged lithographic printing plate having uncovered hydrophilic areas of the hydrophilic substrate and complimentary ink receptive areas of the outer oleophilic surface. In an added embodiment of the method of this invention, the imaged lithographic printing plate is uniformly exposed to thermal energy after step III.

In of each of the embodiments of this invention the aqueous solution preferably has a pH of about 6 or greater; the first polymeric material preferably is insoluble in an organic solvent, and the second polymeric material is soluble in the organic solvent; and the first layer preferably contains a photothermal conversion material particularly when the element is imagewise exposed with a radiant source of energy such as an infrared emitting laser. Preferably, the second layer is free of the photothermal conversion material.

DETAILED DESCRIPTION OF THE INVENTION

This invention relates to an imaging element which can be imaged with thermal energy. More particularly, this invention relates to thermal lithographic printing plates, which can be imaged by thermal energy typically by imagewise exposure with an infrared emitting laser, a thermal printing head, or the like. The lithographic plates described in this invention are made up of a hydrophilic substrate, typically an aluminum or polyester support, and adhered thereto, a thermally sensitive composite layer structure typically composed of two layer coatings. An aqueous developable polymeric mixture containing a solubility inhibiting material, and typically a photothermal conversion material is coated on the hydrophilic substrate to form the first layer. The second layer is composed of one or more non-aqueous soluble polymeric materials which are soluble or dispersible in a solvent which does not dissolve the first layer. As used herein the term "solubility inhibiting material" is intended to include one or more compounds which interact(s) with, or otherwise affects the polymeric compound to reduce the solubility of the first layer in the aqueous solution. In the positive-working thermal imaging element of this invention, the term "photothermal conversion material" is intended to be one or more thermally sensitive components which absorb incident radiation and convert the radiation to thermal energy. Typically, the photothermal conversion material is an "infrared absorbing" compound. When the first layer contains a photothermal conversion material, i.e., a first material, the second layer may contain the same first material or a different photothermal conversion material, i.e., a second material. As used herein, the term "thermally sensitive" is intended to be synonymous with the term "heat sensitive", and the term "image area(s)" is intended to mean the surface area(s) of the imaged plate which is ink-receptive. The plate is exposed in non-image area(s), i.e., areas outside the "image areas" which are not ink-receptive, typically with an infrared laser or a thermal print head. Upon aqueous development of the imaged plate, the exposed portions are developed away thus exposing hydrophilic surfaces of the substrate which are receptive to conventional aqueous fountain solutions. The second layer composed of ink-receptive image areas, protects the underlying aqueous-soluble coating areas from the aqueous developer. In one embodiment of this invention, the second layer may also contain a photothermal conversion material. In this instance, imaging exposure may result in at least partial removal of exposed areas of the second layer from the underlying coating. Any remaining exposed areas of the second layer are removed during development of the imaged plate. In the following description, the invention will be illustrated using infrared radiation, and infrared absorbing material as the photothermal conversion material, but is not intended to be limited thereby. By the use of the solubility inhibiting material in the composite layer structure, solution and development latitude are improved and development can be carried out in a standard processor without production of sludge. In addition, by the use of the composite layer structure of this invention, developability and humidity shelf life are improved relative to single layer, positive-working thermal compositions containing alkali-soluble polymers together with solubility inhibitors.

Plate Construction

The plate construction of the present invention includes a composite layer structure supported by a substrate. The composite layer structure contains at least an ink-receptive, aqueous-insoluble second layer overlying an aqueous-soluble infrared absorbing layer which is adhered to the surface of the substrate. The composite structure may additionally contain intermediate layers such as substrate subbing layers to enhance hydrophilicity or adhesion to the composite structure, or an adhesion promoting interlayer between the second layer and the infrared absorbing layer.

Substrate

Hydrophilic substrates which may be used in the planographic plate of this invention may be any sheet material conventionally used to prepare lithographic printing plates such as metal sheet materials or polymeric sheet material. A preferred metal substrate is an aluminum sheet. The surface of the aluminum sheet may be treated with metal finishing techniques known in the art including brushing roughening, electrochemical roughening, chemical roughening, anodizing, and silicate sealing and the like. If the surface is roughened, the average roughness Ra is preferably in the range from 0.1 to 0.8 $\mu$m, and more preferably in the range from 0.1 to 0.4 $\mu$m. The preferred thickness of the aluminum sheet is in the range from about 0.005 inch to about 0.020 inch. The polymeric sheet material may be comprised of a continuous polymeric film material, a paper sheet, a composite material or the like. Typically, the polymeric sheet material contains a sub-coating on one or both surfaces to modify the surface characteristics to enhance the hydrophilicity of the surface, to improve adhesion to subsequent layers, to improve planarity of paper substrates, and the like. A preferred polymeric substrate comprises polyethylene terephthalate.

Thermally-Sensitive Composite Layer Structure

First Layer

The first layer of the composite layer structure is composed of a polymeric material, a solubility inhibiting material and optionally, a first photothermal conversion material such as an infrared absorbing compound, in which the polymeric material is soluble or dispersible in an aqueous solution having a pH of about 6 or greater, i.e., in a slightly acidic, neutral or alkaline aqueous solution. Useful polymeric materials contain acid functionality and may be composed of one or more polymers or resins. Such polymers and resins include carboxy functional acrylics, acrylics which contain phenol groups and/or sulfonamide groups, cellulosic based polymers and copolymers, vinyl acetate/crotonate/vinyl neodecanoate copolymers, styrene maleic anhydride copolymers, polyvinyl acetals, phenolic resins, maleated wood rosin, and combinations thereof. Typically two polymers are used in combination to achieve the desirable solubility in a wholly aqueous solution having a pH of about 6 or greater and typically between about 8 and about 13.5. Particularly useful in this invention are novolak resins, resole resins and novolakiresole resin mixtures.

Useful polymeric materials are alkali-soluble acrylic resins, which are free of carboxylic acid functionality and which contains at least one of phenolic group, sulfonamide group, N-acylsulfonamide or combinations thereof. Useful acrylic resins of this type include, but are not intended to be limited thereby, a terpolymer of ethyl acrylate, methyl methacrylate and the urea adduct of (1-(1-isocyanato-1-methyl)ethyl-3-(1-methyl)ethenyl benzene)/p-aminophenol reaction product (hereinafter AR-1); a terpolymer of acrylonitrile, methacrylamide and the urea adduct of (1-(1-isocyanato-1-methyl)ethyl-3-(1-methyl)ethenyl benzene)/p-aminophenol reaction product (hereinafter AR-2); a copolymer of acrylonitrile and the urethane adduct of 2-hydroxyethyl methacrylate/p-toluene sulfonyl isocyanate reaction product (hereinafter AR-3); a terpolymer of methacrylamide, N-phenylmaleimide and the urea adduct of (1-(1-isocyanato-1-methyl)ethyl-3-(1-methyl)ethenyl benzene)/p-aminophenol reaction product (hereinafter AR-4); a tetrapolymer of acrylonitrile, methacrylamide, N-phenylmaleimide and the urea adduct of (1-(1-isocyanato-1-methyl)ethyl-3-(1-methyl)ethenyl benzene)/2-amino-4-sulfonamidophenol reaction product (hereinafter AR-5); and a terpolymer of acrylonitrile, methacrylamide and the urea adduct of isocyanatoethyl methacrylate/p-aminophenol reaction product (hereinafter AR-6).

A variety of compounds may be used as solubility inhibiting materials to reduce the solubility of the first layer. Such solubility inhibiting materials (also known as "dissolution inhibitors") may be reversible insolubilizers or they may be compounds which are capable of irreversibly conversion to solvent soluble components.

Reversible insolubilizers typically have polar or ionic functionality that serve as acceptor sites for hydrogen bonding or weak ionic bond formation with groups on the polymeric material such as hydroxy or carboxylic acid groups. A useful class of reversible insolubilizers are nitrogen containing compounds in which at least one nitrogen atom is quaternized, incorporated in a heterocyclic ring, or quaternized and incorporated in a heterocyclic ring. Examples of useful quaternerized nitrogen containing compounds includes triaryl methane dyes such as Crystal Violet (CI base violet 3), Ethyl Violet and Victoria Blue BO, and tetraalkyl ammonium compounds such as Cetrimide (a $C_{14}$ alkyl trimethylammonium bromide). A preferred reversible insolubilizer is a nitrogen-containing heterocyclic compound such as quinoline and triazols, e.g., 1,2,4-triazol. Another preferred reversible insolubilizer is a quaternized heterocyclic compound. Examples of suitable quaternized heterocyclic compounds are imidazoline compounds such as Monazoline C, Monazoline O, Monazoline CY, Monazoline T all of which are manufactured by Mona Industries; quinolinium compounds such as 1-ethyl-2-mehtylquinolinium iodide and 1-ethyl-4-mehtyl-quinolinium iodide; benzothiazolium compounds such as 3-ethyl-2-methyl benzothiazolium iodide; and pyridinium compounds such as cetyl pyridinium bromide, ethyl viologen dibromide, and fluoropyridinium tetrafluoroborate. The quinolinium or benzothiazolium compounds may be cationic cyanine dyes such as Quinoldine Blue, 3-ethyl-2-[3-(3-ethyl-2(3H)-benzothiazolylidene)-2-methyl-1-propenyl] benzothiazolium iodide or Dye A having the structure:

DYE A

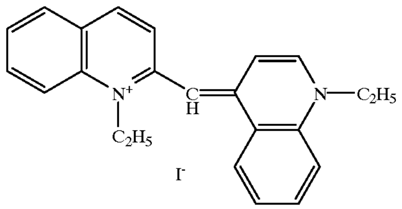

A further useful class of reversible insolubilizers are carbonyl containing compounds such as α-naphthoflavone, β-naphthoflavone, 2,3-diphenyl-1-indeneone, flavone, flavanone, xanthone, benzophenone, N-(4-bromobutyl) phthalimide, and phenanthrenequinone. Formulations useful in preparing the first layer of this invention and which contain reversible insolubilizer compounds are described in WO 97/39894 and U.S. Pat. No. 5,858,626, each being directed to single layer lithographic printing plates.

Solubility inhibiting compounds which are useful in formulating the first layer of this invention may be compounds capable of irreversible conversion to solvent soluble components, such as conventional orthoquinone diazide compounds. Formulations useful in preparing the first layer of this invention and which contain irreversible insolubilizer compounds are described in Sheriff et al., U.S. Pat. No. 5,858,626 which is incorporated herein by reference, and which is directed to single layer lithographic printing plates. Typically an o-diazonaphthoquinone compound is used in admixture with a phenolic resin to form a developer insoluble layer. Alternatively the orthoquinone diazide may be bonded directly to the aqueous solution soluble polymeric material, e.g., through an ester linkage. Upon imaging treatment, the treated areas become soluble in the developer. If the imaging treatment is exposure to ultraviolet radiation the o-diazonaphthoquinone is believed to be irreversibly converted to an indenecarboxylic acid which renders treated areas soluble or dispersible in an alkaline developer. Solubility inhibiting compounds of this type which may be used in the first layer of this invention are o-diazonaphthoquinone derivatives described in the above mentioned U.S. Pat. No. 5,858,626. The disclosed o-diazonaphthoquinone derivatives are used in admixture with a phenolic resin and an infrared absorbing compound in formulations to form a positive-working lithographic plate. Such o-diazonaphthoquinone derivatives typically comprise an o-diazonaphthoquinone moiety or group attached to a ballasting moiety that has a molecular weight of at least 15, but less than 5000. Examples of such o-diazonaphthoquinone derivatives are esters of 2-diazo-1,2-dihydro-1-oxonaphthalene sulfonic acid or carboxylic acid chlorides. Such useful derivatives include, but are not limited to: 2,4-bis(2-diazo-1,2-dihydro-1-oxo-5-naphthalenesulfonyloxy)benzophenone; 2-diazo-1,2-dihydro-1-oxo-5-naphthalenesulfonyloxy-2,2-bis hydroxyphenylpropane monoester; hexahydroxybenzophenone hexaester of 2-diazo-1,2-dihydro-1-oxo-5-naphthalenesulfonic acid; 2,2'-bis(2-diazo-1,2-dihydro-1-oxo-5-naphthalenesulfonyloxy)biphenyl; 2,2',4,4'-tetrakis (2-diazo-1,2-dihydro-1-oxo-5-naphthalenesulfonyloxy) biphenyl; 2,3,4,-tris(2-diazo-1,2-dihydro-1-oxo-5-naphthalenesulfonyloxy)benzophenone; 2,4-bis(2-diazo-1,2-dihydro-1-oxo-4-naphthalenesulfonyloxy)benzophenone; 2-diazo-1,2-dihydro-1-oxo-4-naphthalenesulfonyloxy-,2-bis hydroxyphenylpropane monoester; hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2',4,4'-tetrakis (2-diazo-1,2-dihydro-1-oxo-4-naphthalenesulfonyloxy) biphenyl; 2,3,4,-tris(2-diazo-1,2-dihydro-1-oxo-4-naphthalenesulfonyloxy)benzophenone; and the like such as described in U.S. Pat. No. 5,143,816. In this embodiment the dry weight ratio of phenolic resin to o-diazonaphthoquinone derivative typically is at least 0.5:1, and a weight ratio from about 2:1 to about 6:1 is preferred.

In the alternative embodiment of this invention, the orthoquinone diazide which is a reaction product of the aqueous solution soluble polymeric material (as described above) and an o-diazonaphthoquinone reactive derivative, is used in preparing the first layer. Such a derivative has a functional group (such as chloride or reactive imide group) that can react with a suitable reactive group (for example, a hydroxy group) of the polymeric material (such as a phenolic resin) and thereby become part of the polymeric material, rendering the material sensitive to light. The reactive group can be in the 4- or 5-position of the o-diazonaphthoquinone molecule. Representative reactive compounds include sulfonic and carboxylic acid, ester or amide derivatives of the o-diazonaphthoquinone moiety. Preferred compounds are the sulfonyl chloride or esters, and the sulfonyl chlorides are most preferred. Such reactions with the phenolic resins are described in GB 1,546,633, U.S. Pat. No. 4,308,368 and U.S. Pat. No. 5,145,763. Also useful in the preparation of the first layer are the o-diazonaphthoquinone derivatives of phenolic resins as described in the single layer systems of WO 99/11458 including a condensation polymer of pyrogallol and acetone in which 1,2-naphthoquinone diazide groups are bonded to the phenolic resin through a sulfonyl ester linkage.

In a preferred embodiment of this invention, the first layer contains a first photothermal conversion material such as an infrared absorber. An infrared absorber may be selected from either a dye or pigment. A primary factor in selecting the infrared absorber is its extinction coefficient which measures the efficiency of the dye or pigment in absorbing infrared radiation in accordance with Beer's Law. The extinction coefficient must have a sufficient value in the wavelength region of infrared radiation exposure usually from 780 nm to 1300 nm. Examples of infrared absorbing dyes useful in the present invention include, Cyasorb IR 99 and Cyasorb IR 165 (both available from Glendale Protective Technology), Epolite IV-62B and Epolite III-178 (both available from the Epoline Corporation), PINA-780 (available from the Allied Signal Corporation), Spectra IR 830A and Spectra IR 840A (both available from Spectra Colors Corporation), ADS 830A and ADS 1060A (ADS Corp) and EC 2117 (FEW Wolfen). Examples of infrared absorbing pigments are Projet 900, Projet 860 and Projet 830 (all available from the Zeneca Corporation). Carbon black pigments may also be used. Carbon black pigments are particularly advantageous due to their wide absorption bands since such carbon black-based plates can be used with multiple infrared imaging devices having a wide range of peak emission wavelengths.

In one embodiment of this invention the solubility inhibiting material is the photothermal conversion material. Illustrative of such a material having a dual function is Dye B having the formula:

Dye B

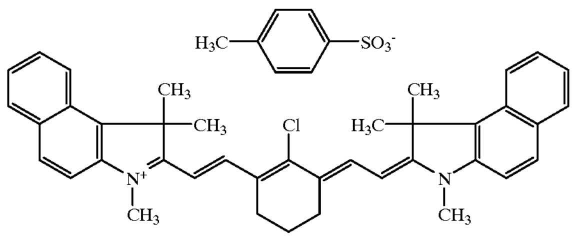

which is used in the single layer formulations described in Haley et al., U.S. Pat. No. 5,340,699, which is incorporated herein by reference.

Second Layer

The second layer of the composite layer structure, i.e. the top layer, is insoluble in the aqueous solution having a pH of about 6 or greater, and contains as an essential ingredient a polymeric material which is ink-receptive and soluble or dispersible in a solvent such as an organic solvent or an aqueous solvent dispersion. Preferably, the polymeric material itself is insoluble in the aqueous solution having a pH of about 6 or greater. Useful polymers of this type include acrylic polymers and copolymers; polystyrene; styrene-acrylic copolymers; polyesters, polyamides; polyureas; polyurethanes; nitrocellulosics; epoxy resins; and combinations thereof. Preferred are polymethylmethacrylate, nitrocellulose and polystyrene. When the first layer contains a photothermal conversion material, the second layer may also contain a photothermal conversion material, which typically is the same infrared absorbing dye which is used as the photothermal conversion material in the first infrared absorbing layer. The second layer may also contain a dye or pigment, such as a printout dye added to distinguish the exposed areas from the unexposed areas during processing; or a contrast dye to distinguish image areas in the finished imaged plate. The second layer may also contain polymeric particles which are incompatible with the second polymeric material. As used herein the term "incompatible" is intended to mean that the polymeric particles are retained as a separate phase within the second polymeric material. Typically, the polymeric particles have an average diameter between about 0.5 μm and about 10 μm. Preferred polymeric particles of this type are poly tetrafluoroethylene particles. The presence of such polymeric particles improves scratch resistance of the composite layer and surprisingly enhances exposure latitude for processing the plate. Typically, the second layer is substantially free of ionic groups.

Plate Precursor Preparation

The composite layer structure may be applied to the substrate by sequentially applying the first layer and then the second layer using conventional coating or lamination methods. Alternatively, both layers may be applied at the same time using multiple layer coating methods such as with slot type coaters; or from a single solution which undergoes self-stratification into top and bottom layers upon drying. However it is important to avoid substantial intermixing the two layers which tends to reduce the sensitivity. Regardless of the method of application, the first layer of the applied composite has an inner surface which is contiguous to the substrate, and the second layer of the applied composite has an outer surface.

The first layer may be applied to the hydrophilic substrate by any conventional method. Typically the ingredients are dissolved or dispersed in a suitable coating solvent, and the resulting solvent mixture is coated by known methods such as by whirl coating, bar coating, gravure coating, roller coating, and the like. Suitable coating solvents include alkoxyalkanols such as 2-methoxyethanol; ketones such as methyl ethyl ketone; esters such as ethyl acetate or butyl acetate; and mixtures thereof.

The second or top layer may be applied to the surface of the thermal conversion layer by any conventional method such as those described above. Typically the ingredients are dissolved or dispersed in a suitable organic coating solvent which is not a solvent for the thermal conversion layer. Suitable coating in solvents for coating the second layer include aromatic solvents such as toluene and mixtures of aromatic solvents with alkanols such as a 90:10 weight ratio of toluene and butanol.

Alternatively, the first layer, the second layer or both layers may be applied by conventional extrusion coating methods from a melt mixture of layer components. Typically, such a melt mixture contains no volatile organic solvents.

Plate Imaging and Processing

The thermal digital lithographic printing plate precursor is imaged by the method comprising the following steps. First a lithographic printing plate precursor is provided which comprises a hydrophilic substrate and adhered thereto, a composite layer structure having an inner surface contiguous to the hydrophilic substrate and an outer oleophilic, ink-receptive surface. The composite layer structure comprises a first layer which forms the inner surface of the composite layer structure and a second layer which forms the outer surface of the composite layer structure. The first layer comprises a first polymeric material; a solubility inhibiting material and a photothermal conversion material, as previously described, in which the first polymeric material is soluble or dispersible in an aqueous solution having a pH of about 6 or greater, and the solubility inhibiting material reduces the solubility of the first layer. The second layer consists essentially of a second polymeric material, as previously described, which is soluble in the organic solvent, wherein the second layer is insoluble in the aqueous solution. Next the composite layer structure is imagewise exposed to thermal energy to provide exposed portions, or areas, and complimentary unexposed portions, or areas, in the composite layer structure. The exposed portions surprisingly are selectively removable by the aqueous solution. Finally, the aqueous solution is then applied to the outer oleophilic surface to remove the exposed portions of the composite layer structure to produce an imaged lithographic printing plate. The resulting imaged lithographic printing plate has uncovered hydrophilic areas of the hydrophilic substrate and complimentary ink receptive areas of the outer oleophilic surface. While not being bound by any particular theory, selective removability of the exposed portions is believed to result from an increased rate of dissolution or dispersibility of the first layer in the aqueous solution, from enhanced permeability of the second layer to the aqueous solution or to a combination thereof. The printing plates of this invention have a distinct advantage over other lithographic printing plate systems, since the plates of this invention possess useful development latitude without the need for pre-development conditioning such as pre-heating prior to development.

The lithographic plate of this invention and its methods of preparation have already been described above. This plate may be imaged with a laser or an array of lasers emitting infrared radiation in a wavelength region that closely matches the absorption spectrum of the first infrared absorbing layer. Suitable commercially available imaging devices include image setters such as a Creo Trendsetter (available from the CREO Corporation, British Columbia, Canada) and a Gerber Crescent 42T (available from the Gerber Corporation). While infrared lasers are preferred other high intensity lasers emitting in the visible or ultraviolet may also be used to image the lithographic plate of this invention. Alternatively, the lithographic plate of this invention may be imaged using a conventional apparatus containing a thermal printing head or any other means for imagewise conductively heating the composite layer such as with a heated stylus, with a heated stamp, or with a soldering iron as illustrated in the following examples.

When portions of the composite layer structure are exposed to infrared radiation, they become selectively removable by an aqueous developer liquid and are removed thereby. The developer liquid may be any liquid or solution which can both penetrate the exposed areas and dissolve or disperse the exposed areas of the infrared absorbing layer without substantially affecting the complimentary unexposed portions of the composite layer structure. Useful developer liquids are the aqueous solutions having a pH of about 6 or above as previously described. Preferred developer solutions are those that have a pH between about 8 and about 13.5. Useful developers include commercially available developers such as PC3000, PC955, PC956, PC4005, PC9000, and Goldstar DC aqueous alkaline developers each available from Kodak Polychrome Graphics, LLC. Typically the developer liquid is applied to the imaged plate by rubbing or wiping the second layer with an applicator containing the developer liquid. Alternatively, the imaged plate may be brushed with the developer liquid or the developer liquid may be applied to the plate by spraying the second layer with sufficient force to remove the exposed areas. Alternatively, the imaged plate can be soaked in the developer liquid, followed by rubbing or brushing the plate with water. By such methods a developed printing plate is produced which has uncovered areas which are hydrophilic and complimentary areas of the composite layer, not exposed to infrared radiation, which are ink receptive.

Although lithographic printing plates having high press life with good ink receptivity are produced at high imaging speeds by the method of this invention, press life surprisingly is further enhanced by uniformly exposing the imaged lithographic printing plate to thermal energy after it has been developed in step III. Such a uniform thermal exposure may be carried out by any conventional heating technique, such as baking, contact with a heated platen, exposure to infrared radiation, and the like. In a preferred mode for post development thermal exposure, the developed imaged lithographic printing plate is passed through a baking oven at 240° C. for 3 minutes after treatment with a baking gum.

The thermal lithographic printing plate of the present invention will now be illustrated by the following examples, but is not intended to be limited thereby.

Synthesis Of Acrylic Binder Resins Free of COOH Groups

Acrylic binder resins were prepared using a four-neck 1 or 2 liter ground glass flask equipped with a mechanical stirrer, long stand (24") condenser, temperature controller, nitrogen purge, pressure equalized addition funnel and heating mantal. All monomers and solvents were used as received.

Synthesis Example 1 (AR-1)

30 g of M-TMI (M-TMI is 1-(1-isocyanato-1-methyl) ethyl-3-(1-methyl)ethenyl benzene, from Cytec industries), 5 g of ethyl acrylate, 15 g of methyl methacrylate and 8 g of t-butyl peroxybenzoate were heated to 120° C. in 232 g of Arcosolve PMAcetate (propylene glycol methyl ether acetate from Arco Chemicals) in a $N_2$ purge. Then a mixture of 90 g of m-TMI, 15 g of ethyl acrylate, 45 g of methyl methacrylate, 16 g of t-butyl peroxybenzoate (Aldrich Chemicals) was added over 2 hours. After the addition was complete, an additional 8 g of t-butyl peroxybenzoate was added in two equal portions. The reaction was completed to theoretical % non-volatiles (50%) in 7 hrs. Then a partial batch of this solution (164.54 g), containing free —NCO groups of m-TMI, was further reacted with p-aminophenol (22.25 g) at 1:1 equivalent ratio. The reaction was monitored by IR-spectroscopy for disappearance of —NCO group at 2275 $cm^{-1}$ and was completed by heating to 40° C. The product (AR-1), terpolymer of ethyl acrylate, methyl methacrylate and the urea adduct of m-TMI/p-aminophenol, was precipitated in powder form using water/ice, filtered and dried at room temperature. The product terpolymer AR-1 had the following structure:

AR-1

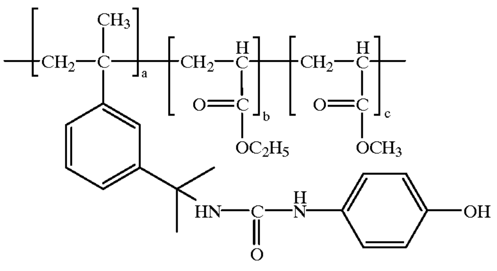

Synthesis Example 2 (AR-2)

201 g of M-TMI and 111.3 g of p-aminophenol were heated in dimethylacetamide (487 g) to 40° C. in a $N_2$ purge. Following completion of the reaction, monitored as above for disappearance of —NCO group by IR, the resulting monomer adduct was precipitated using water/ice, filtered and dried at room temperature. 50 g of the monomer adduct, 10 g of methacrylamide, 40 g of acrylonitrile and 1.0 g of Vazo-64 (from DuPont) were premixed and copolymerized by addition over 2 hrs to a solution of 100 g dimethylacetamide and 0.3 g Vazo-64, heated to 80° C. After the addition was complete, an additional 1.0 g of Vazo-64 was added in two equal portions. The reaction was completed in 8 hr, as determined by conversion to the theoretical % non-volatiles. The product (AR-2), terpolymer of acrylonitrile, methacrylamide and the urea adduct of m-TMI/p-aminophenol, was isolated in powder form as in synthesis example 1. The product terpolymer AR-2 had the following structure:

AR-2

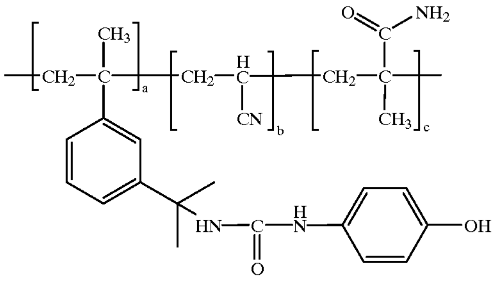

Synthesis Example 3 (AR-3)

65 g of HEMA, 2-hydroxyethyl methacrylate, and 0.4 g of dibutyl tin dilaurate were heated in dimethylacetamide (247 g) to 60° C. in a $N_2$ purge. Then 98 g of TSI, p-toluene sulfonyl isocyanate (from Vanchem Inc), was added at 60° C. over a period of 1 hr. The reaction was completed in 2 hr, as monitored by disappearance of the isocyanate group at 2275 $cm^{-1}$ by IR, and the resulting monomer adduct was precipitated using water/ice, filtered and dried at room temperature. The monomer adduct (37.5 g) was copolymerized with 10 g of acrylonitrile by heating at 80° C. with 0.25 g of Vazo-64 in 61.5 g dimethylacetamide. Then a mixture of 112.5 g of monomer adduct, 30 g of acrylonitrile and 0.5 gram of Vazo-64 were added in 2 hours. After the addition was complete, 0.25 gram of vazo-64 was in 2 equal portions. The reaction was completed, as determined by conversion to the theoretical % non-volatile in 15 hrs. The product (AR-3), copolymer of acrylonitrile and the urethane adduct of HEMA/TSI, was isolated in powder form as in synthesis example 1. The product copolymer AR-3 had the following structure:

AR-3

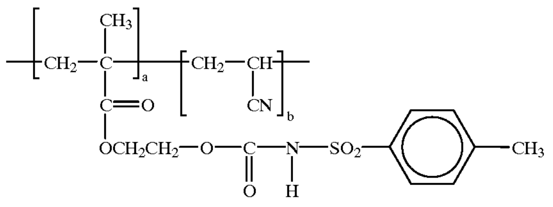

Synthesis Example 4 (AR-4)

201 g of m-TMI and 111.3 g of p-aminophenol were heated to 40° C. in dimethylacetamide (487 g) in a $N_2$ purge. Following completion of the reaction, monitored by disappearance of the isocyanate group at 2275 $cm^{-1}$ by IR, the intermediate monomer adduct was precipitated using water/ice, filtered and dried at room temperature. The monomer adduct (50 g) was copolymerized with 10 g of methacrylamide, 40 g of N-phenylmaleimide (from Nippon Shokubai Co., LTD Japan) by heating at 60° C. with 0.2 g of Vazo-64 in 300 g dimethylacetamide for 22 hrs. The product (AR-4), terpolymer of methacrylamide, N-phenylmaleimide and the urea adduct of TMI/p-aminophenol, was isolated in powder form as in synthesis example 1. The product terpolymer AR-4 had the following structure:

AR-4

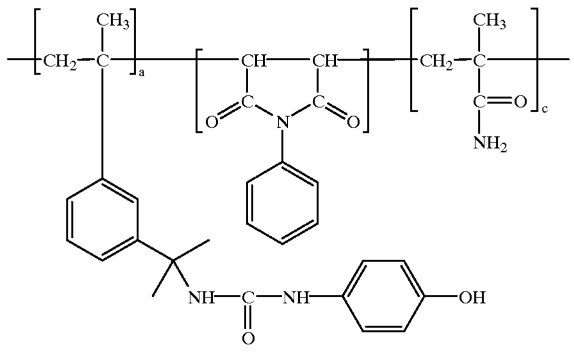

Synthesis Example 5 (AR-5)

32.04 g of m-TMI and 30.0 g of 2-amino-4-sulfonamidophenol were heated to 30° C. in dimethylformamide (98 g) in a $N_2$ purge. Following completion of the reaction, monitored for disappearance of the isocyanate group at 2275 $cm^{-1}$ by IR, the intermediate monomer adduct was precipitated using water/ice, filtered and dried at room temperature. The monomer adduct (35 g) was copolymerized in 300.6 grams of dimethylacetamide with 10 g of methacrylamide, 45 g of N-phenylmaleimide and 10 g of acrylonitrile, using 0.2 g of Vazo-64, by heating first at 60° C. for 22 hrs and then at 80° C. for 10 hrs. The product (AR-5), tetrapolymer of acrylonitrile, methacrylamide, N-phenylmaleimide and the urea adduct of TMI/2-amino-4-sulfonamidophenol, was isolated in powder form as in synthesis example 1. The product tetrapolymer AR-5 had the following structure:

AR-5

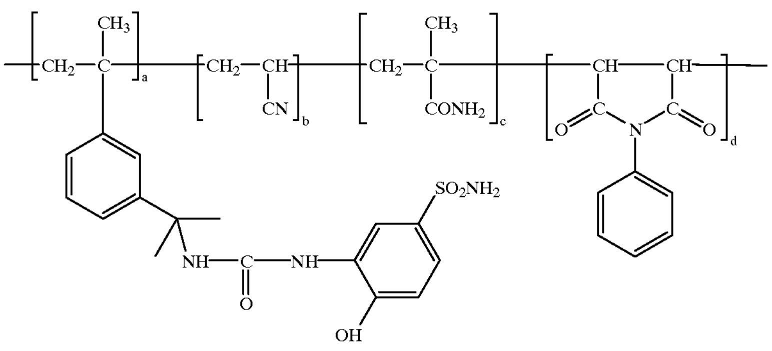

Acrylic Resin (AR-6)

Acrylic resin AR-6, which is a terpolymer of acrylonitrile, methacrylamide and the urea adduct of isocyanatoethyl methacrylate/p-aminophenol, was obtained from Dai Nippon Ink and Chemical Company. The product terpolymer AR-6 had the following structure:

AR-6

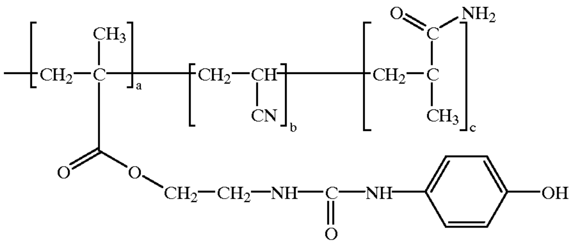

COMPARATIVE EXAMPLE 1

A lithographic printing plate precursor was prepared as follows: To 100 milliliters of 1-methoxy-2-propanol there was added:

(1) 10 milliliters of a 30% by weight solution of a resole resin (UCAR phenolic resin BKS-5928 available from Union Carbide Corporation) in a mixture of 2-butanone and 1-methoxy-2-propanol;

(2) 10 milliliters of a 30% by weight solution of a novolac resin (N-9P NOVOLAK resin available from Eastman Kodak Company) in acetone;

(3) 0.5 grams of 2-methoxy-4-aminophenyl diazonium hexafluorophosphate in 2 milliliters of acetonitrile; and (4) 0.5 grams of an infrared absorbing "Dye B" (described hereinabove) dissolved in 10 milliliters of 1-methoxy-2-propanol.

The resulting solution was spin coated onto an electrochemically grained and anodized aluminum plate at 30 revolutions per minute for one minute and dried in a forced air oven at 100° C. for one minute.

The plate precursor was laser imaged on a Creo Trendsetter thermal exposure device having a laser diode array emitting at 830 nm with a dose of 120 to 250 mJ/cm$^2$. Upon alkali development at ambient temperature with positive developer MX-1710 (from Kodak Polychrome Graphics) having a pH of about 14, laser exposed areas were cleanly removed.

A developer drop test was carried out in which a series of drops of developer were applied to the exposed area as well as to the unexposed (image) area of the undeveloped plate. The time required for the drop of developer to penetrate and remove the coating under the drop was subsequently determined in 5 second intervals. In particular, the drops of the series are applied to the plate surface in sequence in which each subsequent drop is applied to a different spot on the plate surface at a 5 second interval from previous drop application on a previous spot. The drop test is completed 5 seconds after the final drop is applied, by rinsing the plate surface with a stream of water. The surface of the plate is then surveyed for the the most recent spot in the series when the coating has been removed and the time calculated from the number of intervals before rinsing. In this instance, the drop of developer removed the coating under the drop within 10 seconds in the exposed area and within 15 seconds in the unexposed area.

Shelf life of the plate precursor was determined by an accelerated aging test in which samples were stored in a chamber at 80% R.H. and 60° C. At daily intervals a sample was removed from the chamber and imaged and developed as described above. Shelf life in days indicates the length of treatment required before the treated plate precursor fails to produce a useful printing plate. The shelf life of this conditioned plate precursor was determined to be less than 1 day.

EXAMPLE 1

A lithographic printing plate precursor was prepared as described in Comparative Example 1.

13.2 g of A-21 (a 30% solution of polymethylmethacrylate (PMMA) in toluene/butanol 90:10 solvent mixture from Rohm & Haas) was dissolved in 190 g. of toluene. The solution was stirred and then coated on top of the coated layer of above mentioned printing plate precursor.

The coated plate precursor was laser imaged on a Creo Trendsetter thermal exposure device and developed as described in Comparative Example 1 to provide a printing plate in which laser exposed areas were cleanly removed.

The developer drop test, as described in Comparative Example 1, resulted in the removal of the coating under the drop within 10 seconds in the exposed area as observed in Comparative Example 1. However, the coatings under the drop in the unexposed area were not removed within 100 seconds, therby demonstrating improved development latitude of the over-coated plate.

Shelf life of the coated plate precursor as determined by an accelerated aging test in Comparative Example 1, was found to be more than 4 days, indicating a substantially improved shelf life of the coated plate.

COMPARATIVE EXAMPLE 2

A lithographic printing plate precursor was prepared as follows: A coating solution was prepared as a solution in 1-methoxypropane-2-ol/xylene (98:2 wt %) containing 70 parts by weight of LB6564 (a 1:1 phenol/cresol novolak resin supplied by Bakelite, UK); 20 parts by weight of LB744 (a cresol novolak resin supplied by Bakelite, UK); 6 parts by weight of Silikophen P50X, a phenyl methyl siloxane (as supplied by Tego Chemie Service Gmbh, Essen, Germany); 2 parts by weight Crystal Violet (basic violet 3, C.I. 42555, Gentian Violet); and 2 parts by weight of the dye KF654B PINA (as supplied by Riedel de Haan UK, Middlesex, UK) believed to have the structure (hereinafter identified as Dye C):

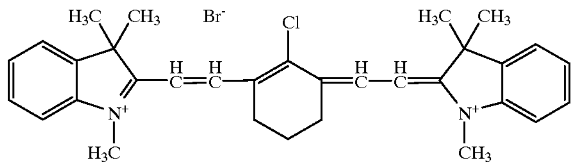

This coating solution was coated by means of a wire wound bar onto a 0.3 mm sheet aluminum which had been electrograined; anodized and post-anodically treated with an aqueous solution of an inorganic phosphate. The solution concentrations were selected to provide a dry film coating weight of 2.5 g/$m^2$ after through drying a 100° C. for three minutes in a Mathis labdryer oven as supplied by Werner Mathis AG, Germany.

The plate precursor was laser imaged on a Creo Trendsetter thermal exposure device having a laser diode array emitting at 830 nm with a dose of 120 to 250 mJ/$cm^2$. Upon alkali development at ambient temperature with positive developer Gold Star-DC (from Kodak Polychrome Graphics) having a pH of about 14, laser exposed areas were cleanly removed.

The developer drop test, as described in Comparative Example 1, was carried out on the exposed undeveloped plate. In this instance, the drop of developer removed the coating under the drop within 15 seconds in the exposed area and within 30 seconds in the unexposed area.

Shelf life of the plate precursor was determined by an accelerated aging test described in Comparative Example 1. The shelf life of this conditioned plate precursor was determined to be 2 days.

EXAMPLE 2

A lithographic printing plate precursor was prepared as described in Comparative Example 2.

13.2 g of A-21 (a 30% solution of polymethylmethacrylate (PMMA) in toluene/butanol 90:10 solvent mixture from Rohm & Haas) was dissolved in 190 g. of toluene. The solution was stirred and then coated on top of the coated layer of above mentioned printing plate precursor.

The coated plate precursor was laser imaged on a Creo Trendsetter thermal exposure device and developed as described in Comparative Example 2 to provide a printing plate in which laser exposed areas were cleanly removed.

The developer drop test, as described in Comparative Example 2, resulted in the removal of the coating under the drop within 15 seconds in the exposed area as observed in Comparative Example 2. However, the coatings under the drop in the unexposed area were not removed within 100 seconds, therby demonstrating improved development latitude of the over-coated plate.

Shelf life of the coated plate precursor as determined by an accelerated aging test in Comparative Example 1, was found to be more than 4 days, indicating a substantially improved shelf life of the coated plate.

COMPARATIVE EXAMPLE 3

A lithographic printing plate precursor was prepared as follows: A polymeric coating was prepared by dissolving 0.2 g SpectralR830 dye (available from Spectra Colors Corp., Kearny, N.J.), 0.05 g ethyl violet, 0.6 g Uravar FN6 resole phenolic resin (available from DSM, Netherlands), 1.5 g PMP-65 co-polymer (PMP-65 co-polymer is based on methacrylamide, acrylonitrile, methylmethacrylate, and APK which is methacryloxyethylisocyanate reacted with aminophenol (available from Polychrome Corporation), and 7.65 g PD140A novolac resin (available from Borden Chemicals, MA), into 100 g solvent mixture containing 15% Dowanol PM, 40% 1,3-dioxolane and 45% methanol. The solution was coated with a wire wound bar onto an EG-aluminum substrate and dried at 100° C. for 5 minutes to produce a uniform polymeric coating having a coating weight of 1.8 to 2.2 g/$m^2$.

The plate precursor was laser imaged on a Creo Trendsetter thermal exposure device having a laser diode array emitting at 830 nm with a dose of 120 to 250 mJ/$cm^2$. Upon alkali development at ambient temperature with positive developer PC-4000 (from Kodak Polychrome Graphics) having a pH of about 14, laser exposed areas were cleanly removed.

The developer drop test, as described in Comparative Example 1, was carried out on the exposed undeveloped plate. In this instance, the drop of developer removed the coating under the drop within 20 seconds in the exposed area and within 50 seconds in the unexposed area.

Shelf life of the plate precursor was determined by an accelerated aging test described in Comparative Example 1. The shelf life of this conditioned plate precursor was determined to be less than 2 days.

EXAMPLE 3

A lithographic printing plate precursor was prepared as described in Comparative Example 3.

13.2 g of A-21 (a 30% solution of polymethylmethacrylate (PMMA) in toluene/butanol 90:10 solvent mixture from Rohm & Haas) was dissolved in 190 g. of toluene. The solution was stirred and then coated on top of the coated layer of above mentioned printing plate precursor.

The coated plate precursor was laser imaged on a Creo Trendsetter thermal exposure device and developed as described in Comparative Example 3 to provide a printing plate in which laser exposed areas were cleanly removed.

The developer drop test, as described in Comparative Example 3, resulted in the removal of the coating under the drop within 20 seconds in the exposed area as observed in Comparative Example 3. However, the coatings under the drop in the unexposed area were not removed within 100 seconds, therby demonstrating improved development latitude of the over-coated plate.

Shelf life of the coated plate precursor as determined by an accelerated aging test in Comparative Example 1, was found to be 4 days, indicating a substantially improved shelf life of the coated plate.

COMPARATIVE EXAMPLE 4

A lithographic printing plate precursor was prepared as follows: A photosensitive coating formulation was prepared using a cresol-formaldehyde resin (purchased from Schenectady Chemical Company) derivatized (3%) with 2-diazo-1,2-dihydro-1-oxo-5-naphthalenesulfonyl chloride 45.3 g of derivatized resin), 2-[2-[2-chloro-3-[(1,3-dihydro-1,1,3-trimethyl-2H-benz[e]indol-2-ylidene)ethylidene-1-cyclohexen-1-yl]ethenyl]-1,1,3-trimethyl-1H-benz[e]indolium, salt with 4-methylbenzenesulfonic acid IR absorbing dye (0.626 g), and 1-methoxy-2-propanol solvent (950 g). This formulation was applied to give a dry coating weight of 1 g/$m^2$ onto electrochemically grained and sulfuric acid anodized aluminum sheets that had been further treated with an acrylamide-vinylphosphonic acid copolymer (according to U.S. Pat. No. 5,368,974,) to form the lithographic printing plate precursor.

The plate precursor was laser imaged on a Creo Trendsetter thermal exposure device having a laser diode array emitting at 830 nm with a dose of 120 to 250 mJ/$cm^2$. Upon alkali development at ambient temperature with positive developer PC-3000 (from Kodak Polychrome Graphics) having a pH of about 14, laser exposed areas were cleanly removed.

The developer drop test, as described in Comparative Example 1, was carried out on the exposed undeveloped plate. In this instance, the drop of developer removed the coating under the drop within 10 seconds in the exposed area and within 20 seconds in the unexposed area.

Shelf life of the plate precursor was determined by an accelerated aging test described in Comparative Example 1. The shelf life of this conditioned plate precursor was determined to be less than 2 days.

EXAMPLE 4

A lithographic printing plate precursor was prepared as described in Comparative Example 4.

13.2 g of A-21 (a 30% solution of polymethylmethacrylate (PMMA) in toluene/butanol 90:10 solvent mixture from Rohm & Haas) was dissolved in 190 g. of toluene. The solution was stirred and then coated on top of the coated layer of above mentioned printing plate precursor.

The coated plate precursor was laser imaged on a Creo Trendsetter thermal exposure device and developed as described in Comparative Example 4 to provide a printing plate in which laser exposed areas were cleanly removed.

The developer drop test, as described in Comparative Example 4, resulted in the removal of the coating under the drop within 10 seconds in the exposed area as observed in Comparative Example 4. However, the coatings under the drop in the unexposed area were not removed within 100 seconds, therby demonstrating improved development latitude of the over-coated plate.

Shelf life of the coated plate precursor as determined by an accelerated aging test in Comparative Example 1, was found to be 4 days, indicating a substantially improved shelf life of the coated plate.

EXAMPLE 5

A lithographic printing plate precursor was prepared as described in Comparative Example 1.

13.2 g of A-21 (a 30% solution of polymethylmethacrylate (PMMA) in toluene/butanol 90:10 solvent mixture from Rohm & Haas) was dissolved in 190 g. of toluene. 0.24 g of MP-1100 (polytetrafluoroethylene additive, available from DuPont Co.) was added to the PMMA solution to provide an 8:1 wt. ratio of PMMA: MP-1100. The resulting mixture was stirred and then coated on top of the coated layer of above mentioned printing plate precursor.

The coated plate precursor was laser imaged on a Creo Trendsetter thermal exposure device and developed as described in Comparative Example 1 to provide a printing plate in which laser exposed areas were cleanly removed.

EXAMPLE 6

A lithographic printing plate precursor was prepared as described in Example 2 except that the precursor plate of Comparative Example 2 contained ADS-1060 IR dye in place of KF654B PINA.

The coated plate precursor was laser imaged on a Gerber Crescent 42T exposure device, emitting at 1064 nm, and developed as described in Comparative Example 2. Laser exposed areas of both the bottom layer and overcoat layer were removed without affecting the unexposed areas of either layer.

COMPARATIVE EXAMPLE 7

A lithographic printing plate precursor was prepared as follows:

A coating formulation was prepared using 90.5% by weight of solids of PD140A, 5.5% by weight of solids of ADS 1060 (a 1060 nm sensitive IR dye from ADS, Montreal, Canada), 2.0% by weight of solids of IR Sensi a 830 nm sensitive IR dye from FEW Wolfen, Germany), and 2.0% by weight of solids of Ethyl Violet was dissolved in a solvent mixture of Dowanol PM, 1,3-Dioxolane and Methanol (15:45:40 vol. %) to give a 16% by weight of solids solution. This solution was coated on an EG grained polyvinylphosphonic sealed substrate to give a dry coating weight of 2.0 $g/m^2$.

Two plate precursors were laser imaged with a 810 nm laser diode mounted on a rotating drum to provide single lines and solid areas. One imaged plate was then developed with aqueous alkaline developer Goldstar DC (from Kodak Polychrome Graphics) and the other imaged plate was developed in aqueous alkaline developer PC4005 (from Kodak Polychrome Graphics). While the laser exposed areas could be selectively developed with Goldstar DC; areas not exposed by the laser were strongly attacked by the PC4005 developer.

EXAMPLE 7

A lithographic printing plate precursor was prepared as described in Comparative Example 7 in which the coated layer formed the Bottom Layer.

Top Layer: A 3% by weight butyl acetate solution of nitrocellulose E950 (available from Wolff Walsrode, Germany) was coated over the bottom layer of the above plate to give a dry coating weight of 0.35 $g/m^2$.

Two plate precursors were laser imaged and developed as described in Comparative Example 7. For both imaged plates the developers removed only the IR exposed areas.

COMPARATIVE EXAMPLE 8

A lithographic printing plate precursor was prepared as follows:

A coating formulation was prepared using 89% by weight of solids of PD140A, 1.5% by weight of solids of tetrahydrophthalic acid anhydride, 5.5% by weight of solids of ADS 1060, 2.0% by weight of solids of IR Sensi, and 2.0% by weight of solids of Ethyl Violet, dissolved in a solvent mixture of Dowanol PM, 1,3-Dioxolane and Methanol (15:45:40 vol. %) to give a 16% by weight of solids solution. This solution was coated on an EG grained polyvinylphosphonic sealed substrate to give a dry coating weight of 2.0 $g/m^2$.

Three plate precursors were laser imaged with a 810 nm laser diode mounted on a rotating drum to provide single lines and solid areas. One imaged plate was then developed with aqueous alkaline developer Goldstar DC a second imaged plate was developed in aqueous alkaline developer PC4000, and a third imaged plate was developed in 10% sodium metasilicate solution. For each of the imaged plates, areas not exposed by the laser were strongly attacked by each of the Goldstar DC developer, the PC4000 developer and the 10% sodium metasilicate solution.

EXAMPLE 8

A lithographic printing plate precursor was prepared as described in Comparative Example 8 in which the coated layer formed the Bottom Layer.

Top Layer: A 3% by weight butyl acetate solution of nitrocellulose E950 was coated over the bottom layer of the above plate to give a dry coating weight of 0.34 $g/m^2$.

Three plate precursors were laser imaged and developed as described in Comparative Example 8. For each of the imaged plates, the developers removed only the IR exposed areas so that a good ink-receptive image remained on a clean background. The resistance of the image to developer attack was determined by soaking non imaged plates in Goldstar DC developer and in PC4000 developer. For both developers, removal of areas not exposed to IR radiation took longer than 4 minutes.

COMPARATIVE EXAMPLE 9

A lithographic printing plate precursor was prepared as follows:

A coating formulation was prepared using 78% by weight of solids of LB 6564 (a phenolic resin from Bakelite), 4.6% by weight of solids of LB 744 (a phenolic resin from Bakelite), 1.8% by weight of solids of KF 654 (an IR active dye from Riedel de Haen), 1.8% by weight of solids of Crystal Violet (from Aldrich), 13.8% by weight of solids of Makrolon 3108 polycarbonate (from Bayer AG), and 0.03% by weight of solids of FC 430 (a fluorocarbon surfactant from 3M, St. Paul, Minn.), dissolved in a solvent mixture of methyl glycol and 1,3-Dioxolane (15:85 vol. %) to give a 10% by weight of solids solution. This solution was coated on an EG grained polyvinylphosphonic sealed substrate to give a dry coating weight of 2.0 $/m^2$.

Two plate precursors were laser imaged with a 810 nm laser diode mounted on a rotating drum to provide single lines and solid areas. One imaged plate was then developed with aqueous alkaline developer Goldstar DC, and the other imaged plate was developed in 10% sodium metasilicate solution. For each of the imaged plates, areas not exposed by the laser were strongly attacked by each of the Goldstar DC developer and the 10% sodium metasilicate solution when the plates were soaked in the developers for less than 30 seconds.

EXAMPLE 9

A lithographic printing plate precursor was prepared as described in Comparative Example 9 in which the coated layer formed the Bottom Layer.

Top Layer: A 3% by weight butyl acetate solution of nitrocellulose E950 was coated over the bottom layer of the above plate to give a dry coating weight of 0.30 $g/m^2$.

Each two layer plate precursor was laser imaged and developed as described in Comparative Example 8. For each of the imaged plates, the developers removed only the IR exposed areas so that a good ink-receptive image remained on a clean background. The resistance of the image to developer attack was determined by soaking non imaged plates in Goldstar DC developer and in 10% sodium metasilicate solution. For both developers, removal of areas not exposed to IR radiation took longer than 4 minutes.

COMPARATIVE EXAMPLE 10

A lithographic printing plate precursor was prepared as follows: A coating formulation was prepared using 0.75 g PD140A, 0.15 g PMP-92 co-polymer (PMP-92 co-polymer is based on methacrylamide, N-phenyl-maleimide, and APK which is methacryloxyethylisocyanate reacted with aminophenol (available from Polychrome Corporation), 0.10 g CAP (a cellulosic resin from Eastman Kodak Co.) 0.04 g ADS 830A, and 0.03 g Ethyl Violet, dissolved in 13 g of a solvent mixture of Dowanol PM, 1,3-Dioxolane and Methanol (15:45:40 vol. %). This solution was coated on an electrolytically grained, anodized and polyvinylphosphonic sealed substrate to give a dry coating weight of 1.9 g/$m^2$.

Two plate precursors were laser imaged with a 810 nm laser diode mounted on a rotating drum to provide single lines and solid areas. One imaged plate was then developed with aqueous alkaline developer PC2000M (from Kodak Polychrome Graphics LLC) a second imaged plate was developed in 10% sodium metasilicate solution. For the imaged plate soaked in PC2000M developer for 120 seconds, areas not exposed by the laser were strongly attacked; and for the imaged plate soaked in 10% sodium metasilicate solution for less than 20 seconds, areas not exposed by the laser were strongly attacked.

EXAMPLE 10

A lithographic printing plate precursor was prepared as described in Comparative Example 10 in which the coated layer formed the Bottom Layer.

Top Layer: A 3% by weight butyl acetate solution of nitrocellulose E950 was coated over the bottom layer of the above plate to give a dry coating weight of 0.30 g/m2.

Two plate precursors were laser imaged and developed as described in Comparative Example 8. Each plate showed good developability after 15 seconds so that the developers removed only the IR exposed areas to produce a good ink-receptive image on a clean background. The resistance of the image to developer attack was determined by soaking imaged plates in PC2000M developer and in the 10% sodium metasilicate solution. For both developers, removal of areas not exposed to IR radiation took longer than 4 minutes. The resistance of the image to blanket wash mixture composed of petroleum ether:isopropanol (85:15) was determined by washing the imaged and developed plates in the blanket wash mixture. The imaged plates were resistant to the blanket wash mixture for more than 4 minutes.

EXAMPLE 11

A coating solution was prepared by dissolving 8.5 g of polyvinyl phenol (from SiberHegner, Baltimore, Md.), 10.5 g of acrylic resin AR-1, 3.38 g of ADS-830A IR dye (from American Dye Source, Inc, Quebec, Canada) and 0.113 g of Victoria Blue BO indicator dye in 353 g of solvent mixture, consisting of 30% 2-methoxyethanol, 25% methyl ethyl ketone and 45% methanol. The solution was spin coated on a grained and anodized aluminum substrate at 80 rpm and dried at 60° C. for 4 min to produce a uniform coating having a coating weight between 1.4 to 1.6 g/$m^2$.

The resulting coated substrate was over-coated with a solution of 1% toluene solution of Acryloid A-21 (a polymethyl methacrylate solution from Rohm & Haas) by spin coated at 50 rpm, resulting in a second layer coating weight of 0.3 g/$m^2$. The resultant 2-layer plate was laser imaged on a Creo Trendsetter exposure device having a laser diode array emitting at 830 nm with a dose of 200 mJ/$cm^2$.

The imaged plate was developed with aqueous developer PC-T-1 53 (from Kodak Polychrome Graphics), which removed the laser exposed regions. The resulting plate was mounted on an OMCSA-Harris-125 press and provided 45,000 impressions.

EXAMPLE 12

A coating solution was prepared by dissolving 3.89 g of acrylic resin AR-6, 0.563 g of ADS-830 IR dye and 0.045 g of Victoria Blue BO indicator dye into 70.5 g of 2-methoxyethanol. The solution was spin coated on a grained and anodized aluminum substrate at 80 rpm and dried at 60° C. for 4 minutes to produce a uniform coating having a coating weight between 1.4 to 1.6 g/$m^2$.

The resulting coated substrate was over-coated and laser imaged as described in example 11. The imaged plate was developed with aqueous developer JK-5 (a mixture of Kodak Polychrome Graphics developer PD-1, Kodak Polychrome Graphics developer 951 and water at 1:1:6 volume ratio), which removed the laser-exposed regions.

The resulting plate provided 185,000 impressions on an OMCSA-Harris—125 press and had excellent resistance to alkaline plate cleaners (Prisco LPC and Rycoline both having pH >13) as well as to UV/EB ink plate washes.

EXAMPLE 13

A coating solution was prepared by dissolving 6.49 g of acrylic resin AR-3, 0.938 g of ADS-830 IR dye and 0.075 g of Victoria Blue BO indicator dye into a mixture of 50.5 g of 2-methoxyethanol, 50.5 g of dioxalane and 16.5 g of methyl lactate. The solution was spin coated on a grained and anodized aluminum substrate at 80 rpm and dried at 60° C. for 4 minutes to produce a uniform coating having a coating weight between 1.4 to 1.6 g/$m^2$.

The resulting coated substrate was over-coated and laser imaged as described in example 11. The imaged plate was developed with an aqueous developer 955 or 956 (from Kodak Polychrome Graphics), which removed the laser exposed regions, to provide a positive working plate.

EXAMPLE 14

A coating solution was prepared by dissolving 5.7 g of acrylic resin AR-2, 3.8 g of AR-3, 1.38 g of ADS-830A IR dye and 0.11 g of Victoria Blue BO indicator dye into a mixture of 80.3 g of 2-methoxyethanol, 80.3g of dioxalane and 26.5 g of methyl lactate. The solution was spin coated on a grained and anodized aluminum substrate at 80 rpm and dried at 60° C. for 4 minutes to produce a uniform coating having a coating weight between 1.4 to 1.6 g/$m^2$.

The resulting coated substrate was over-coated and laser imaged as described in example 11. The imaged plate was developed with aqueous developer JK-6 (a mixture of Kodak Polychrome Graphics PD-1 (25%), Kodak Polychrome Graphics 951 (17%), benzyl alcohol (3%), Cyna-50 (from Mona Industries) (3%) and water (52%), which removed the laser exposed regions, to provide a positive working plate.

EXAMPLE 15

Example 14 was repeated using 5.7 g of acrylic resin AR-4 in place of AR-2, to provide an analogous positive working plate.

EXAMPLE 16

Example 15 was repeated using 5.7g acrylic resin AR-5 in place of AR-4, to provide an analogous positive working plate.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A positive-working thermal imaging element comprising;

A. a substrate; and

B. a thermally sensitive composite layer structure having an inner surface contiguous to the substrate and an outer surface, the composite layer structure comprising:

(a) a first layer having the inner surface, the first layer comprising a first polymeric material, wherein the first polymeric material is soluble or dispersible in an aqueous solution, and a solubility inhibiting material which reduces the solubility of the first layer in the aqueous solution; and (b) a second layer having the outer surface, the second layer comprising a second polymeric material, wherein the second layer is insoluble in the aqueous solution, and wherein when the first layer is free of photothermal conversion material, the second layer is free of photothermal conversion material;

wherein, upon heating the composite layer structure, the heated composite layer structure has an increased rate of removal in the aqueous solution.

2. The imaging element of claim 1 wherein the aqueous solution has a pH of about 6 or greater.

3. The imaging element of claim 1 wherein the first layer contains photothermal conversion material.

4. The imaging element of claim 3, wherein the second layer contains photothermal conversion material.

5. The imaging element of claim 4 wherein photothermal conversion material in the first layer and photothermal conversion material in the second layer are the same material.

6. The imaging element of claim 3, wherein the second layer is free of photothermal conversion material.

7. The imaging element of claim 1 wherein the imaging element is insensitive to infrared radiation when the first layer is free of photothermal conversion material.

8. The imaging element of claim I wherein upon heating the composite layer structure, the first layer has an increased rate of dissolution or dispersibility in the aqueous solution.

9. The imaging element of claim 1 wherein upon heating the composite layer structure, the second layer has enhanced permeability to the aqueous solution.

10. The imaging element of claim 1 wherein the first polymeric material is taken from the group consisting of carboxy functional acrylics, acrylics which contain phenol groups, acrylics which contain sulfonamido groups, acrylics which contain N-acrylsulfonamide groups, cellulosic based polymers and copolymers, vinyl acetate/crotonate/vinyl neodecanoate copolymers, styrene maleic anhydride copolymers, polyvinyl acetals, phenolic resins, maleated wood rosin, and combinations thereof.

11. The imaging element of claim 10 wherein the first polymeric material is a phenolic resin.

12. The imaging element of claim 11 wherein the first polymeric material is a novolak resin, a resole resin or a novolak/resole resin mixture.

13. The imaging element of claim 1 wherein the first polymeric material is an alkali-soluble acrylic resin, which is free of carboxylic acid functionality and which contains at least one of phenolic group, sulfonamide group, N-acylsulfonamide or a combination thereof.

14. The imaging element of claim 1 wherein the first polymeric material is an acrylic resin selected from the group consisting of a terpolymer of ethyl acrylate, methyl methacrylate and a urea adduct of (1-(1-isocyanato-1-methyl)ethyl-3-(1-methyl)ethenyl benzene)/p-aminophenol reaction product; a terpolymer of acrylonitrile, methacrylamide and the urea adduct of (1-(1-isocyanato-1-methyl) ethyl-3-(1-methyl)ethenyl benzene)/p-aminophenol reaction product; a copolymer of acrylonitrile and a urethane adduct of 2-hydroxyethyl methacrylate/p-toluene sulfonyl isocyanate reaction product; a terpolymer of methacrylamide, N-phenylmaleimide and the urea adduct of (1-(1-isocyanato-1-methyl)ethyl-3-(1-methyl)ethenyl benzene)/p-aminophenol reaction product; a tetrapolymer of acrylonitrile, methacrylamide, N-phenylmaleimide and a urea adduct of (1-(1-isocyanato-1-methyl)ethyl-3-(1-methyl)ethenyl benzene)/2-amino-4-sulfonamidophenol reaction product; and a terpolymer of acrylonitrile, methacrylamide and a urea adduct of isocyanatoethyl methacrylate/p-aminophenol reaction product.

15. The imaging element of claim 1 wherein the solubility inhibiting material is a nitrogen containing compound in which at least one nitrogen atom is quaternized, is incorporated in a heterocyclic ring, or is quaternized and incorporated in a heterocyclic ring.

16. The imaging element of claim 15 wherein the quaternized nitrogen containing compound is a triaryl methane dye; a tetraalkyl ammonium compound; a quinoline compound, a triazole compound; a quinolinium compound; a benzothiazolium compound; a pyridinium compound; or a cationic cyanine dye.

17. The imaging element of claim 16 wherein the quaternized nitrogen containing compound is a compound selected from the group consisting of Crystal Violet (CI base violet 3); Ethyl Violet; Victoria Blue BO; $C_{14}$ alkyl trimethyl-ammonium bromide; 1,2,4-triazol; Monazoline C; Monazoline O; Monazoline CY; Monazoline T; 1-ethyl-2-mehtylquinolinium iodide; 1-ethyl-4-mehtyl-quinolinium iodide; 3-ethyl-2-methyl benzothiazolium iodide; cetyl pyridinium bromide; ethyl viologen dibromide; fluoropyridinium tetrafluoroborate; Quinoldine Blue; 3-ethyl-2-[3-(3-ethyl-2(3H)-benzothiazolylidene)-2-methyl-1-propenyl] benzothiazolium iodide; Dye A having the structure:

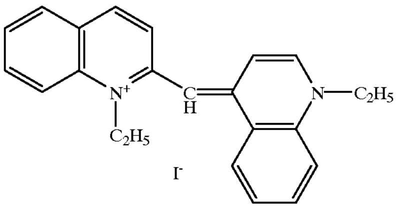

Dye B having the structure:

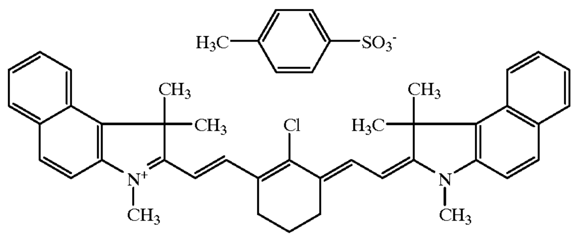

Dye C having the structure:

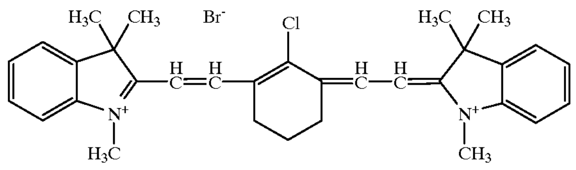

and mixtures thereof.

18. The imaging element of claim 1 wherein the solubility inhibiting material is a carbonyl containing compound.

19. The imaging element of claim 18 wherein the carbonyl containing compound is α-naphthoflavone, β-naphthoflavone, 2,3-diphenyl-1-indeneone, flavone, flavanone, xanthone, benzophenone, N-(4-bromobutyl) phthalimide, or phenanthrenequinone.

20. The imaging element of claim 1 wherein the solubility inhibiting material is an o-diazonaphthoquinone compound.

21. The imaging element of claim 20 wherein the o-diazonaphthoquinone compound is bonded to the first polymeric material.

22. The imaging element of claim 1 wherein the second polymeric material is selected from the group consisting of acrylic polymers and copolymers; polystyrene; styrene-acrylic copolymers; polyesters, polyamides; polyureas; polyurethanes; nitrocellulosics; epoxy resins; and combinations thereof.

23. The imaging element of claim 22 wherein the second polymeric material is polymethylmethacrylate.

24. The imaging element of claim 22 wherein the second polymeric material is nitrocellulose.

25. A positive-working, lithographic printing plate precursor comprising;

A. a hydrophilic substrate; and

B. a thermally sensitive composite layer structure having an inner surface contiguous to the hydrophilic substrate and an outer oleophilic, ink-receptive surface, the composite layer structure comprising:

(a) a first layer having the inner surface, the first layer comprising a first polymeric material and photothermal conversion material, wherein the first polymeric material is soluble or dispersible in an aqueous solution, and a solubility inhibiting material which reduces the solubility of the first layer in the aqueous solution; and (b) a second layer having the outer oleophilic, ink-receptive surface, the second layer comprising a second polymeric material, wherein the second layer is insoluble in the aqueous solution;

wherein, upon heating the composite layer structure, the heated composite layer structure has an increased rate of removal in the aqueous solution.

26. The precursor of claim 25 wherein the second layer is free of photothermal conversion material.

27. The precursor of claim 25 wherein the aqueous solution has a pH of about 6 or greater.

28. The precursor of claim 25 wherein the first polymeric material is insoluble in an organic solvent, and the second polymeric material is soluble in the organic solvent.

29. The precursor of claim 25 wherein the photothermal conversion material is an infrared absorbing compound.

30. The precursor of claim 29 wherein the infrared absorbing compound is an infrared absorbing dye or pigment.

31. The precursor of claim 25 wherein the second polymeric material is selected from the group consisting of acrylic polymers and copolymers; polystyrene; styrene-acrylic copolymers; polyesters, polyamides; polyureas; polyurethanes; nitrocellulosics; epoxy resins; and combinations thereof.

32. The precursor of claim 25 wherein the second polymeric material is polymethylmethacrylate.

33. The precursor of claim 25 wherein the second layer contains a dye or pigment.

34. The precursor of claim 25 wherein the second layer contains polymeric particles which are incompatible with the second polymeric material.

35. The precursor of claim 34 wherein the polymeric particles are poly tetrafluoroethylene particles.

36. The precursor of claim 25 wherein the aqueous solution has a pH between about 8 and about 13.5.

37. The precursor of claim 25 wherein the first polymeric material contains acid functionality.

38. The precursor of claim 37 wherein the acid functionality is derived from carboxylic acid groups, phenolic groups, sulfonamide groups or a combination thereof.

39. The precursor of claim 25 wherein the first polymeric material is taken from the group consisting of carboxy functional acrylics, acrylics which contain phenol groups, acrylics which contain sulfonamido groups, acrylics which contain N-acrylsulfonamide groups, cellulosic based polymers and copolymers, vinyl acetate/crotonate/vinyl neodecanoate copolymers, styrene maleic anhydride copolymers, polyvinyl acetals, phenolic resins, maleated wood rosin, and combinations thereof.

40. The precursor of claim 25 wherein the hydrophilic substrate is an aluminum substrate.

41. The precursor of claim 40 wherein the aluminum substrate has a grained oxidized surface and wherein the first layer is applied to the a grained oxidized surface.

42. The precursor of claim 25 wherein the hydrophilic substrate is a polymeric sheet material.

43. The precursor of claim 42 wherein the polymeric sheet material is comprised of polyethylene terephthalate.

44. A method for forming a planographic printing plate comprising the steps, in the order given:

I) providing a lithographic printing plate precursor comprising;

A. a hydrophilic substrate; and

B. a thermally sensitive composite layer structure having an inner surface contiguous to the hydrophilic substrate and an outer oleophilic surface, the composite layer structure comprising:

(a) a first layer having the inner surface, the first layer comprising a first polymeric material, wherein the first polymeric material is soluble or dispersible in an aqueous solution, and a solubility inhibiting material which reduces the solubility of the first layer in the aqueous solution; and (b) a second layer having the outer oleophilic surface, the second layer comprising a second polymeric material, wherein the second layer is insoluble in the aqueous solution, and wherein when the first layer is free of photothermal conversion material the second layer is free of photothermal conversion material;

II) imagewise exposing the composite layer structure to thermal energy to provide exposed portions and complimentary unexposed portions in the composite layer structure, wherein the exposed portions are selectively removable by the aqueous solution; and III) applying the aqueous solution to the outer oleophilic surface to remove the exposed portions to produce an imaged lithographic printing plate having uncovered hydrophilic areas of the hydrophilic substrate and complimentary ink receptive areas of the outer oleophilic surface.

45. The method of claim 44 wherein exposed portions of the first layer in the composite layer structure have an increased rate of solubility or dispersibility in the aqueous solution.

46. The method of claim 44 wherein exposed portions of the second layer in the composite layer structure have enhanced permeability to the aqueous solution.

47. The method of claim 44 wherein the aqueous solution has a pH of about 6 or greater.

48. The method of claim 44 wherein the aqueous solution has a pH between about 8 and about 13.5.

49. The method of claim 44 wherein the first layer contains photothermal conversion material.

50. The method of claim 49 wherein imagewise exposing is carried out with an infrared emitting laser and photothermal conversion material is an infrared absorbing compound.

51. The method of claim 49 wherein imagewise exposing is carried out with a thermal printing head.

52. The method of claim 44 wherein imagewise exposing is carried out with a thermal printing head.

53. The method of claim 44 wherein, after step lll, the imaged lithographic printing plate is uniformly exposed to thermal energy.

* * * * *

UNITED STATES PATENT AND TRADEMARK OFFICE
CERTIFICATE OF CORRECTION

PATENT NO. : 6,352,811 B1
DATED : March 5, 2002
INVENTOR(S) : Patel et al.

It is certified that error appears in the above-identified patent and that said Letters Patent is hereby corrected as shown below:

Title page,
Item [75], Inventors, delete "Shahhikant" and insert therefor -- Shashikant --

Column 6,
Line 14, delete "novolakiresole" and insert therefor -- novolak/resole --

Column 7,
Line 4, delete "mehtylquinolinium" and insert therefor -- methylquinolinium --
Line 5, delete "mehtyl" and insert therefor -- methyl --

Column 14,
Line 1, delete "was in" and insert therefor -- was added in --

Column 26,
Line 50, delete "mehtylquinolinium" and insert therefor -- methylquinolinium --
Line 50, delete "mehtyl" and insert therefor --methyl --

Column 28,
Line 51, delete "a"

Signed and Sealed this

Thirtieth Day of July, 2002

*Attest:*

JAMES E. ROGAN

*Attesting Officer*

*Director of the United States Patent and Trademark Office*